United States Patent
Bae et al.

(10) Patent No.: US 8,238,147 B2
(45) Date of Patent: Aug. 7, 2012

(54) MULTI-LEVEL PHASE CHANGE MEMORY DEVICE, PROGRAM METHOD THEREOF, AND METHOD AND SYSTEM INCLUDING THE SAME

(75) Inventors: Jun-Soo Bae, Gyeonggi-do (KR); Hideki Horii, Seoul (KR); Jong-Chan Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1000 days.

(21) Appl. No.: 12/283,409

(22) Filed: Sep. 11, 2008

(65) Prior Publication Data

US 2009/0073754 A1   Mar. 19, 2009

(30) Foreign Application Priority Data

Sep. 13, 2007 (KR) .................. 10-2007-0093170

(51) Int. Cl.
*G11C 11/00* (2006.01)
(52) U.S. Cl. .................. 365/163; 365/148; 977/754
(58) Field of Classification Search .............. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | |
|---|---|---|---|
| 5,995,416 A | 11/1999 | Naura et al. | |
| 6,625,054 B2 | 9/2003 | Lowrey et al. | |
| 6,667,900 B2 * | 12/2003 | Lowrey et al. | 365/171 |
| 6,768,665 B2 * | 7/2004 | Parkinson et al. | 365/113 |
| 6,813,177 B2 * | 11/2004 | Lowrey et al. | 365/148 |
| 6,928,022 B2 | 8/2005 | Cho et al. | |
| 6,967,865 B2 | 11/2005 | Lee | |
| 6,982,913 B2 | 1/2006 | Oh et al. | |
| 7,372,754 B2 | 5/2008 | Hwang et al. | |
| 2002/0041947 A1 * | 4/2002 | Chin et al. | 428/64.4 |
| 2003/0123277 A1 | 7/2003 | Lowrey et al. | |
| 2003/0123284 A1 * | 7/2003 | Lowrey et al. | 365/175 |
| 2004/0114419 A1 * | 6/2004 | Lowrey et al. | 365/148 |
| 2006/0072370 A1 * | 4/2006 | Kuh et al. | 365/232 |
| 2006/0151849 A1 * | 7/2006 | Czubatyj | 257/467 |
| 2007/0025155 A1 | 2/2007 | Hwang et al. | |
| 2007/0297221 A1 * | 12/2007 | Philipp et al. | 365/163 |

FOREIGN PATENT DOCUMENTS

| | | |
|---|---|---|
| KR | 10-2004-0075033 | 8/2004 |
| KR | 10-2005-0046771 | 5/2005 |
| KR | 10-2007-0013601 | 1/2007 |

* cited by examiner

*Primary Examiner* — Richard Elms
*Assistant Examiner* — Harry W Byrne
(74) *Attorney, Agent, or Firm* — Onello & Mello, LLP

(57) ABSTRACT

In a program method for a multi-level phase change memory device, multi-level data to be programmed in a selected memory cell is received, and a program signal is applied to the selected memory cell according to the received multi-level data. Herein, a rising time of the program signal is set to be longer than a falling time of the program signal.

19 Claims, 10 Drawing Sheets

Memory Cell

MULTI-LEVEL PHASE CHANGE MEMORY DEVICE, PROGRAM METHOD THEREOF, AND METHOD AND SYSTEM INCLUDING THE SAME

CROSS-REFERENCE TO RELATED APPLICATIONS

This U.S. non-provisional patent application claims priority under 35 U.S.C. §119 of Korean Patent Application No. 10-2007-0093170, filed in the Korean Intellectual Property Office on Sep. 13, 2007, the entire contents of which are hereby incorporated by reference.

BACKGROUND OF THE INVENTION

The present invention relates to semiconductor memory devices, and more particularly, to multi-level phase change memory devices.

A variety of computer memory technologies are used to store computer programs and data. Examples of the computer memory technologies include a dynamic random access memory (DRAM), a static random access memory (SRAM), an erasable programmable read-only memory (EPROM), and an electrically erasable programmable read-only memory (EEPROM). Some memory technologies need a voltage to retain stored data, while other memory technologies do not need a voltage to retain stored data.

There is an increasing demand for a nonvolatile memory that can be repetitively read and written. A typical example of the nonvolatile memory is a flash memory. The flash memory uses a floating gate transistor that retains charges on an insulated floating gate. Each memory cell of the flash memory can be electrically programmed to "1" or "0" by injecting/removing electrons into/from the floating gate. However, it is difficult to further scale down memory cells. Further, memory cells consume a relatively large amount of power, and their read/program speed is relatively slow.

Phase change memory devices have recently been proposed as nonvolatile memory devices. The phase change memory devices use materials that can be electrically changed between different structured states having different electrical read characteristics. Examples of the materials used for the phase change memory devices are chalcogenide materials such as germanium antimony tellurium (GeSbTe) compounds (hereinafter referred to as GST materials). The GST material is programmed between an amorphous state with a relatively high resistivity and a crystalline state with a relatively low resistivity. The GST material is programmed by heating. The heating intensity and heating time duration determine whether the GST material is in an amorphous or crystalline state. High and low resistivities represent programmed values "1" and "0", which can be sensed by measuring the resistivity of the GST material.

In a typical phase change memory device, a memory cell includes a resistance element and a switching element. The switching element can be implemented using various elements such as MOS transistors and diodes. As illustrated in FIG. 1, the resistance element includes a phase change layer 1 formed of GST material, an upper electrode 2 disposed on the phase change layer 1, and a lower electrode 3 disposed on the phase change layer 1. When a pulse current is applied to the memory cell, the applied pulse current flows through the lower electrode 3. When a pulse current with a very short pulse of several ns to several tens of ns is applied to the memory cell, only a portion of the phase change layer adjacent to the lower electrode 3 is heated by joule heat. At this point, a heating profile difference changes the portion (the hatched section of FIG. 1) of the phase change layer I into a crystalline state (or a "set state") or an amorphous state (or a "reset state"). For example, as illustrated in FIG. 2, a first pulse current i1 is applied to the memory cell and is removed within a short time of ins in order to change the phase change layer 1 into an amorphous state (or a reset state). Also, as illustrated in FIG. 2, a second pulse current i2 smaller than the first pulse current i1 is applied to the memory cell and is removed after a time period of 30~50 ns in order to change the phase change layer 1 into a crystalline state (or a set state). Thus, the PRAM memory cell is set to one of the crystalline state and the amorphous state according to the above-described method.

Recently, in the technical field of phase change memories, efforts are being made to store M-bit data (M: an integer equal to or greater than 2), instead of 1-bit data, in one memory cell. Hereinafter, such phase change memory devices are referred to as multi-level (or multi-bit) phase change memory devices. A crystalline state and a plurality of amorphous states with different resistance values must be defined in order to store multi-level data in one memory cell. To this end, at least two resistance values (hereinafter referred to as intermediate resistance values corresponding to at least two intermediate states) must be defined between a resistance value (e.g., about 10 k$\Omega$; hereinafter referred to as the minimum resistance value) of the memory cell with the crystalline state (or the lowest state) and another resistance value (e.g., about 1 M$\Omega$; hereinafter referred to as the maximum resistance value) of the memory cell with the amorphous state (or the highest state). However, since the voltage range of a reset pulse for programming memory cells to have intermediate resistance values (or intermediate states) is very narrow, the intermediate resistance values (or the intermediate states) are difficult to define. This will be described in detail below.

FIG. 3 is a graph obtained by repetitively applying a set pulse and a reset pulse to memory cells while gradually increasing a pulse voltage step by step. As illustrated in FIG. 3, a set pulse and a reset pulse have the same voltage level, but a falling time of the set pulse is set to be later than a falling time of the reset pulse. The memory cell is set to the set state (corresponding to the minimum resistance value) using a set pulse with a pulse voltage of about 1.6 V, and is set to the reset state (corresponding to the maximum resistance value) using a reset pulse with a pulse voltage of about 2.0 V. As can be seen from FIG. 3, there is a small voltage margin between the set pulse voltage (e.g., about 1.6 V) and the reset pulse voltage (e.g., about 2.0 V). Therefore, it is difficult to define at least two intermediate resistance values between the minimum resistance value of the set state and the maximum resistance value of the reset state. A transition curve (e.g., the dotted section of FIG. 3) slopes steeply from the set state to the rest state. This means that it is difficult to define the resistance values corresponding to the intermediate states between the set state and the reset state. In conclusion, it is difficult to define the amorphous states having at least two intermediate resistance values between the minimum resistance value of the set state and the maximum resistance value of the reset state, by using a reset pulse illustrated in FIG. 3, i.e., a program signal having a rising time of 10 ns, a sustain time of 500 ns and a falling time of 10 ns.

SUMMARY OF THE INVENTION

The present invention provides a multi-level phase change memory device with an improved program margin and a program method thereof.

According to a first aspect, the present invention is directed to program methods for a multi-level phase change memory device, the program methods including: receiving multi-level data to be programmed in a selected memory cell; and applying a program signal to the selected memory cell according to the received multi-level data, wherein the rising time of the program signal is set to be longer than the falling time of the program signal.

In some embodiments, the received multi-level data corresponds to one of a lowest state, a highest state, and a plurality of intermediate states between the lowest state and the highest state.

In some embodiments, when the received multi-level data corresponds to one of the intermediate states, the rising time of the program signal is set to be longer than the falling time of the program signal.

In some embodiments, the voltage levels of program signals corresponding respectively to the intermediate states are set differently depending on the intermediate states.

In some embodiments, the rising slopes of program signals corresponding respectively to the intermediate states are set equally regardless of the intermediate states.

In some embodiments, the program signal is set to have a sustain time between the rising time and the falling time.

In some embodiments, the voltage levels of program signals corresponding respectively to the intermediate states are set equally regardless of-the intermediate states.

In some embodiments, the rising slopes of program signals corresponding respectively to the intermediate states are set differently depending on the intermediate states.

In some embodiments, the program signal is set to have a sustain time between the rising time and the falling time.

In some embodiments, the voltage levels of program signals corresponding respectively to the intermediate states are set equally regardless of the intermediate states; and the rising slopes of program signals corresponding respectively to the intermediate states are set differently depending on the intermediate states.

In some embodiments, the program signal is set to have a sustain time between the rising time and the falling time.

In some embodiments, when the received multi-level data corresponds to one of the intermediate states, the program signal has a triangular waveform whose rising time is set to be longer than a falling time.

According to another aspect, the present invention is directed to multi-level phase change memory devices which include: a memory cell array including a plurality of memory cells; a selector circuit configured to select at least one of the memory cells; and a write driver circuit configured to apply a program signal to the selected memory cell according to multi-level data to be programmed in the selected memory cell, wherein the rising time of the program signal is set to be longer than the falling time of the program signal.

In some embodiments, the multi-level data corresponds to one of a lowest state, a highest state, and a plurality of intermediate states between the lowest state and the highest state.

In some embodiments, when the multi-level data corresponds to one of the intermediate states, the rising time of the program signal is set to be longer than the falling time of the program signal.

In some embodiments, the program signal is set to have a sustain time between the rising time and the falling time.

In some embodiments, when the multi-level data corresponds to one of the intermediate states, the program signal has a triangular waveform whose rising time is set to be longer than a falling time.

According to another aspect, the invention is directed to a memory card which includes a multi-level phase change memory device which operates according to the program method of the invention.

According to another aspect, the invention is directed to a computing system comprising a multi-level phase change memory device according to the invention.

BRIEF DESCRIPTION OF THE FIGURES

The foregoing and other objects, features and advantages of the invention will be apparent from the more particular description of preferred aspects of -the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Throughout the specification, the terms "write" and "program" have the same meaning.

Below, a multi-level phase change memory device is used as one example for illustrating characteristics and functions of the present invention. However, those skilled in the art can understand other advantages and performances of the present invention according to the descriptions. The present invention may be embodied or applied through other embodiments.

Figure 4:
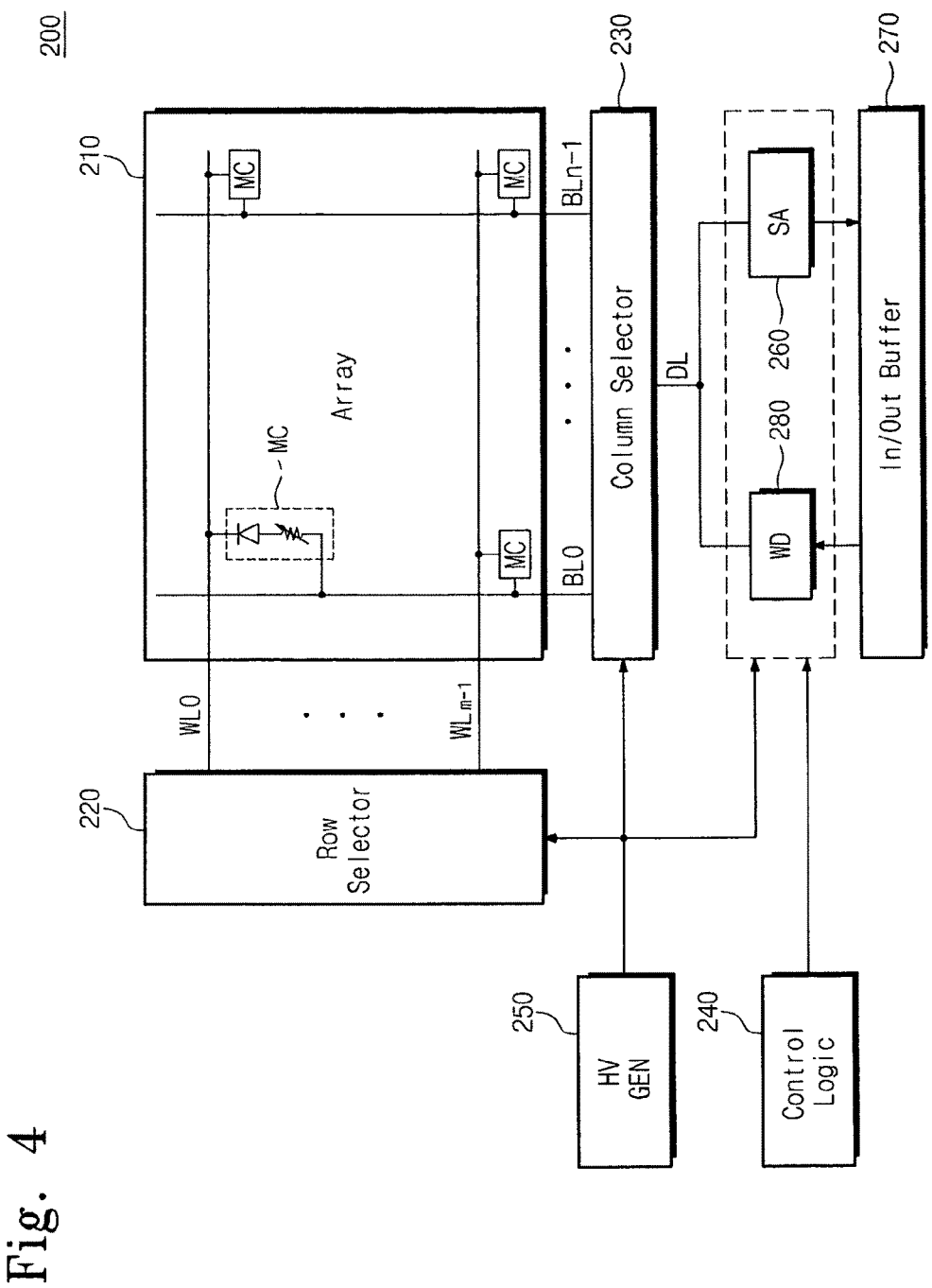
FIG. 4 is a block diagram of a multi-level phase change memory device according to exemplary embodiments of the present invention.

FIG. 4 is a block diagram of a multi-level phase change memory device according to exemplary embodiments of the present invention.

Referring to FIG. 4, a multi-level phase change memory device 200 according to the present invention includes a memory cell array 210 storing M-bit data (M: an integer equal to or greater than 2). The memory cell array 210 includes a plurality of memory cells (MCs) that are arranged in rows (or word lines) WL0~WLm-1 and columns (or bit lines) BL0~BLn-1. Each of the MCs includes a switching element and a resistance element. The switching element may be implemented using various elements such as MOS transistors and diodes. The resistance element may be constructed to include a phase change layer formed of chalcogenide material such as GST material. Each MC is an overwritable memory cell. Examples of the resistance element are disclosed in U.S. Pat. No. 6,928,022 entitled "WRITE DRIVE CIRCUIT IN PHASE CHANGE MEMORY DEVICE AND METHOD FOR APPLYING WRITE CURRENT", U.S. Pat. No. 6,967,865 entitled "LOW-CURRENT AND HIGH-SPEED PHASE-CHANGE MEMORY DEVICES AND METHODS OF DRIVING THE SAME", and U.S. Pat. No. 6,982,913 entitled "DATA READ CIRCUIT FOR USE IN A SEMICONDUCTOR MEMORY AND A MEMORY THEREOF", the contents of which are hereby incorporated by reference.

A row selector circuit 220 selects at least one of the rows (or the word lines) in response to a row address, and a column selector circuit 230 selects a subset of the columns (or the bit lines) in response to a column address. A control logic unit 240 is configured to control an overall operation of the phase change memory device 200 in response to an external command. A high voltage generator circuit 250 is controlled by the control logic unit 240, and is configured to generate a high voltage used in the row selector circuit 220, the column selector circuit 230, a sense amplifier circuit 260, and a write driver circuit 280. For example, the high voltage generator circuit 250 may be implemented using a charge pump. However, those skilled in the art will recognize that the high voltage generator circuit 250 may be implemented using a variety of other elements besides a charge pump.

The sense amplifier circuit 260 is controlled by the control logic unit 240, and senses cell data through the columns (or the bit lines) selected by the column selector circuit 230 in a read operation. The sensed data is output through an input/output (I/O) buffer circuit 270. The sense amplifier circuit 260 is connected to a data line DL, and supplies a sense current to the data line DL in the read operation. The write driver circuit 280 is controlled by the control logic unit 240, and provides one of a set pulse and reset pulse as a program signal to the data line DL according to data (multi-level or multi-bit data) received through the I/O buffer circuit 270.

The set pulse for a program signal is set to have a rising section, an intermediate section and a falling section. Each of the reset pulses for a program signal is set to have a rising section, an intermediate section and a falling section, or to have a rising section and a falling section. The multi-level data corresponds to a resistance value belonging to one of a plurality of resistance/data states (distributions). Herein, the resistance/data states (e.g., 4 states for 2-bit data) include a state corresponding to the minimum resistance value (hereinafter referred to as the lowest state corresponding to a 2-bit data of 00), a state corresponding to the maximum resistance value (hereinafter referred to as the highest state corresponding to 2-bit data of 11), and intermediate states arranged between the lowest state and the highest state (corresponding respectively to 2-bit data of 01 and 2-bit data of 10). According to the multi-level phase change memory device of the present invention, each of the reset pulses necessary for programming the memory cells to amorphous states with intermediate resistance values (i.e., intermediate states) is set in such a way that a rising time of the rising section is longer than a falling time of the falling section (or a rising slope of the rising section is gentler than a falling slope of the falling section). This will be described in detail below.

FIGS. 5 through 10 illustrate various embodiments of a set pulse and reset pulse according to the multi-level phase change memory device of the present invention.

Figure 5:
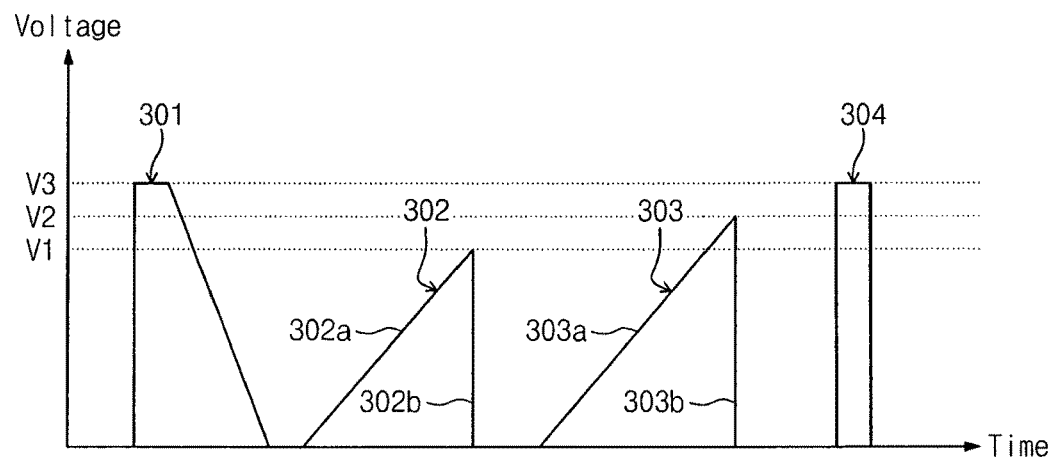
FIGS. 5 through 10 are diagrams illustrating various embodiments of a set pulse and reset pulses according to a multi-level phase change memory device of the present invention.
Figure 6:
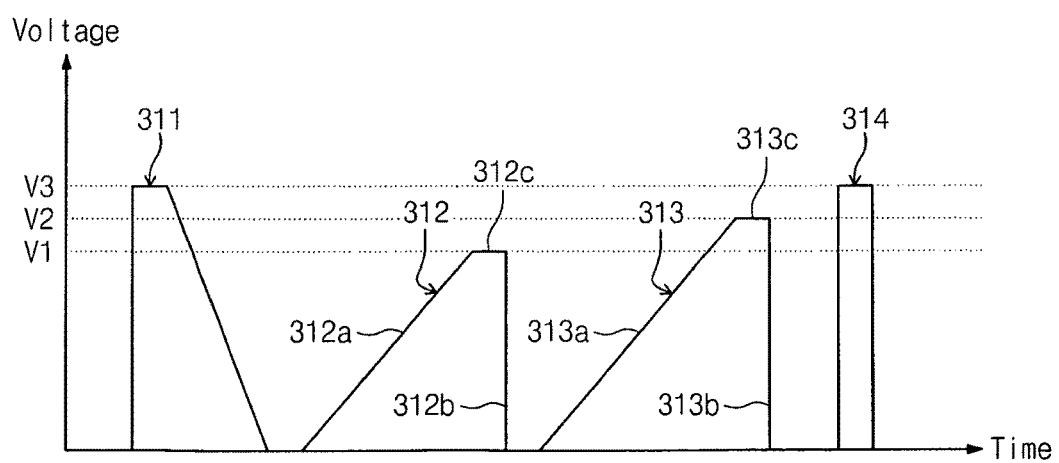

Referring to FIG. 5, a set pulse 301 is used to program a memory cell to have the minimum resistance value (e.g., about 10 kΩ), and a reset pulse 304 is used to program a memory cell to have the maximum resistance value (e.g., about 1 MΩ). Herein, the set pulse 301 and the reset pulse 304 have the same pulse voltage V3. In an exemplary embodiment, the reset pulse 304 has a rising time of about 10 ns and a falling time of about 10 ns. Reset pulses 302 and 303 are used to program memory cells to have intermediate resistance values, respectively. The reset pulses 302 and 303 are set to have the same rising slope and have different pulse voltages V1 and V2, respectively. As illustrated in FIG. 5, the reset pulses 302 and 303 are triangular pulses. For example, the reset pulse 302 is set in such a way that a rising slope of a rising section 302a is more gradual than a falling slope of a falling section 302b and it has no intermediate section. That is, the reset pulse 302 is set in such a way that a rising time of a rising section 302a is longer than a falling time of a falling section 302b and it has no intermediate section. Likewise, the reset pulse 303 is set in such a way that a rising slope of a rising section 303a is more gradual than a falling slope of a falling section 303b and it has no intermediate section. That is, the reset pulse 303 is set in such a way that a rising time of a rising section 303a is longer than a falling time of a falling section 303b and it has no intermediate section. The reset pulses 302 and 303 corresponding respectively to the intermediate resistance values are set to have the same rising slope (or the same rising time, e.g., about 200 ns to about 300 ns). In another exemplary embodiment, as illustrated in FIG. 6, a reset pulse 312/313 is set to have an intermediate section 312c/313c (or a predetermined sustain time, e.g., about 100 ns).

Figure 7:
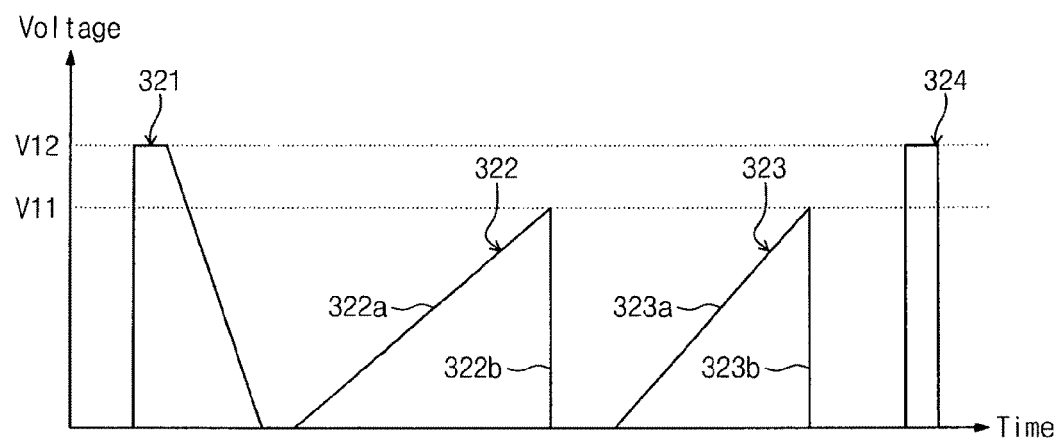
Figure 8:
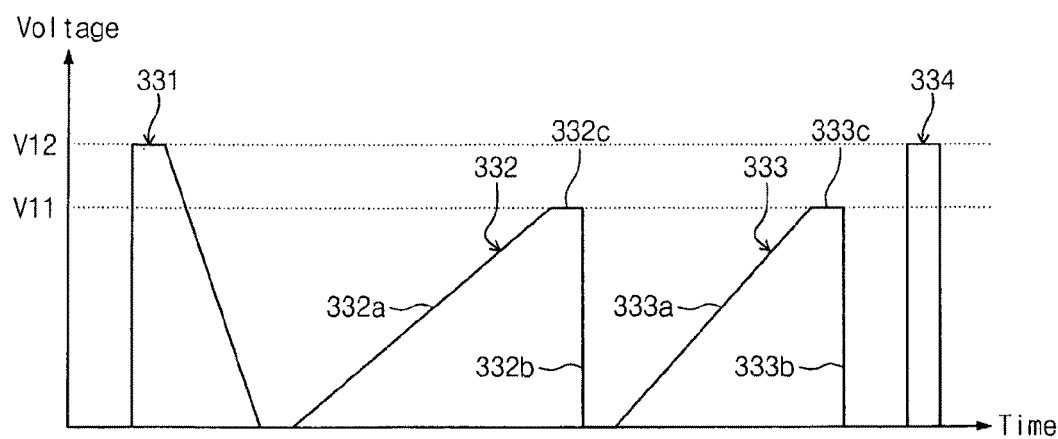

Referring to FIG. 7, a set pulse 321 corresponding to the lowest state is used to program a memory cell to have the minimum resistance value, and a reset pulse 324 corresponding to the highest state is used to program a memory cell to have the maximum resistance value. Herein, the set pulse 321 and the reset pulse 324 have the same pulse voltage V12. Reset pulses 322 and 323 are used to program memory cells to have intermediate resistance values (or intermediate states), respectively. The reset pulses 322 and 323 are set to have different rising slopes (or different rising times) and have the same pulse voltage V11. As illustrated in FIG. 7, the reset pulses 322 and 323 are triangular pulses. For example, the reset pulse 322 is set in such a way that a rising slope of a rising section 322a is more gradual than a falling slope of a falling section 322b and it has no intermediate section. Likewise, the reset pulse 323 is set in such a way that a rising slope of a rising section 323a is more gradual than a falling slope of a falling section 323b and it has no intermediate section. In another exemplary embodiment, as illustrated in FIG. 8, a reset pulse 332/333 is set to have an intermediate section 332c/333c.

Figure 9:
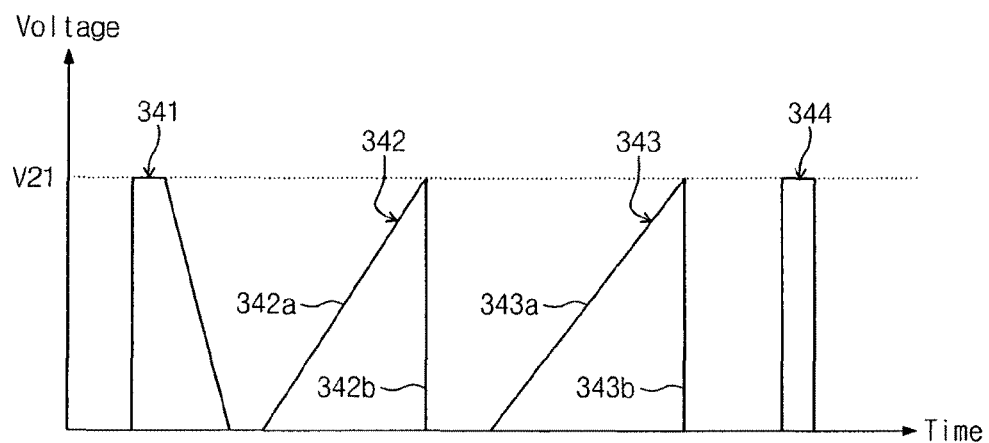
Figure 10:
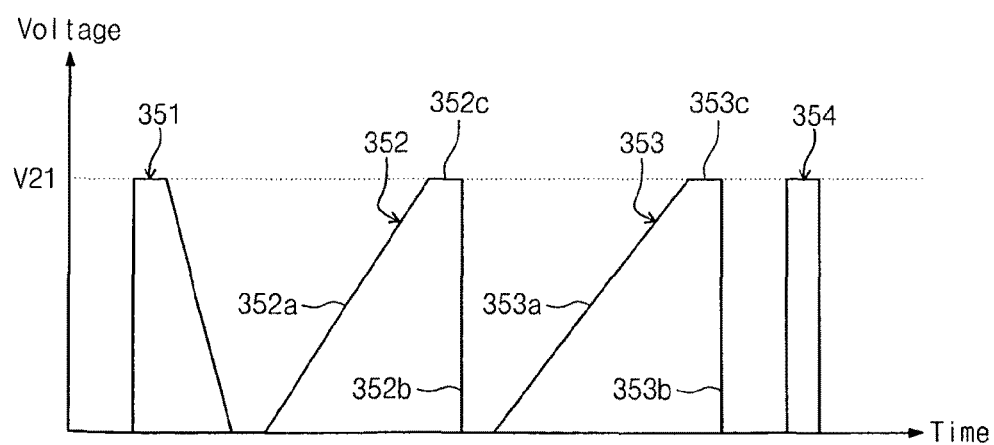

Referring to FIG. 9, a set pulse 341 corresponding to the lowest state is used to program a memory cell to have the minimum resistance value, and a reset pulse 344 corresponding to the highest state is used to program a memory cell to have the maximum resistance value. Herein, the set pulse 341 and the reset pulse 344 have the same pulse voltage V12. Reset pulses 342 and 343 are used to program memory cells to have intermediate resistance values (or intermediate states), respectively. The reset pulses 342 and 343 are set to have different rising slopes (or different rising times) and have the same pulse voltage V21. As illustrated in FIG. 9, the reset pulses 342 and 343 are triangular pulses. For example, the reset pulse 342 is set in such a way that a rising slope of a rising section 342a is more gradual than a falling slope of a falling section 342b and it has no intermediate section. Likewise, the reset pulse 343 is set in such a way that a rising slope of a rising section 343a is gentler than a falling slope of a falling section 343b and it has no intermediate section. In another exemplary embodiment, as illustrated in FIG. 10, a reset pulse 352/353 is set to have an intermediate section 352c/353c.

Figure 11A:
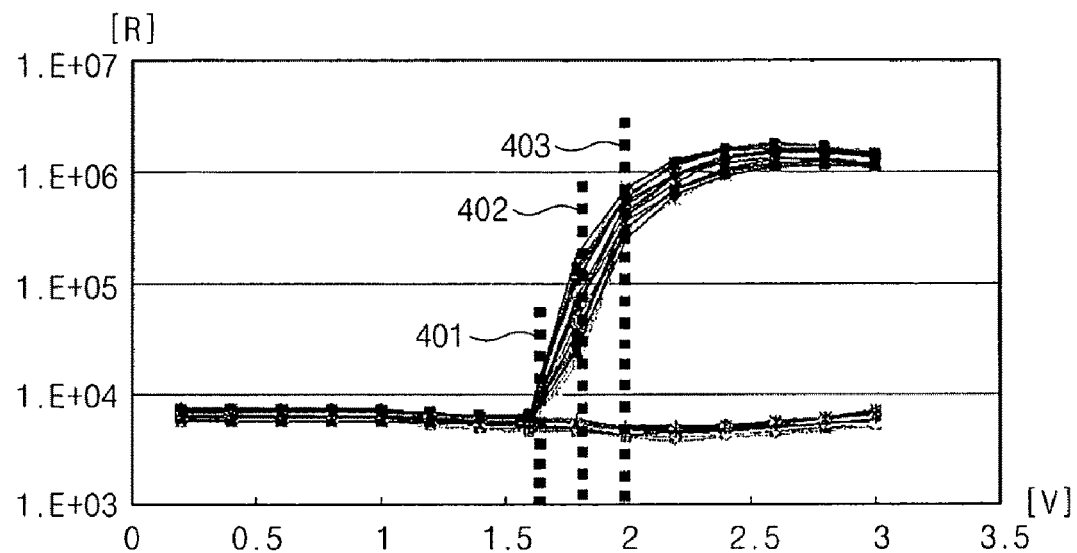
FIG. 11A is a diagram illustrating a resistance distribution and a transition curve obtained when a typical square wave is used as a program signal for programming an intermediate state.
Figure 11A:
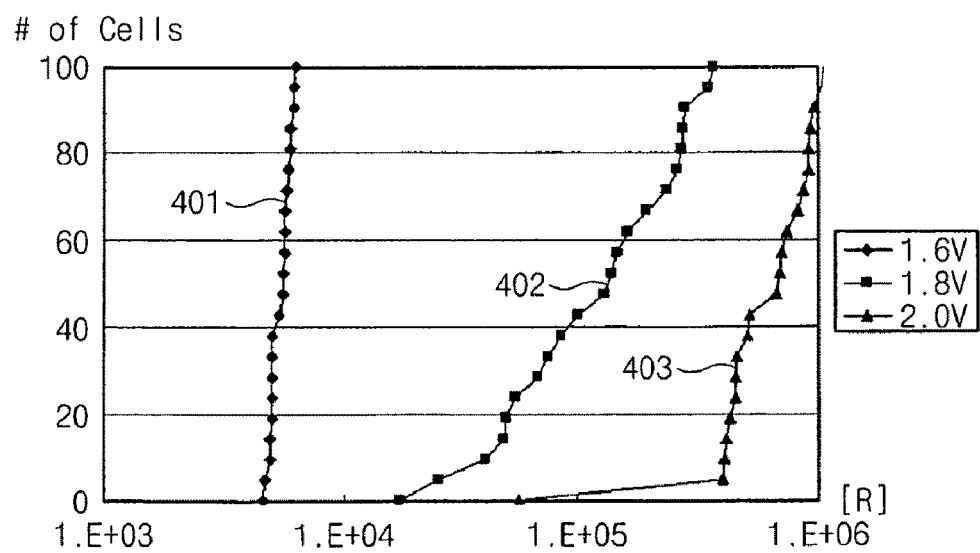
Figure 11B:
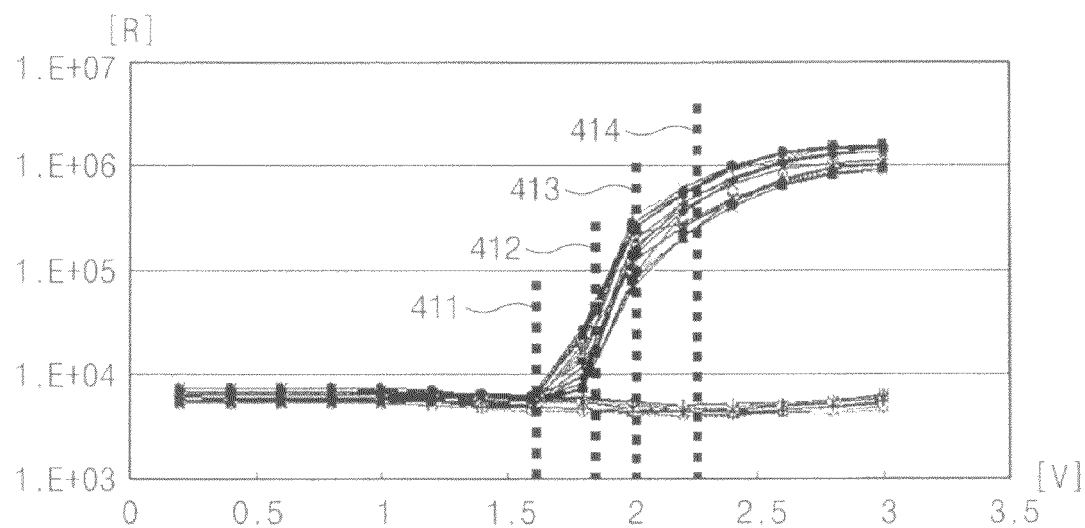
FIG. 11B is a diagram illustrating a resistance distribution and a transition curve obtained when a triangular wave according to the present invention is used as a program signal for programming an intermediate state.
Figure 11B:
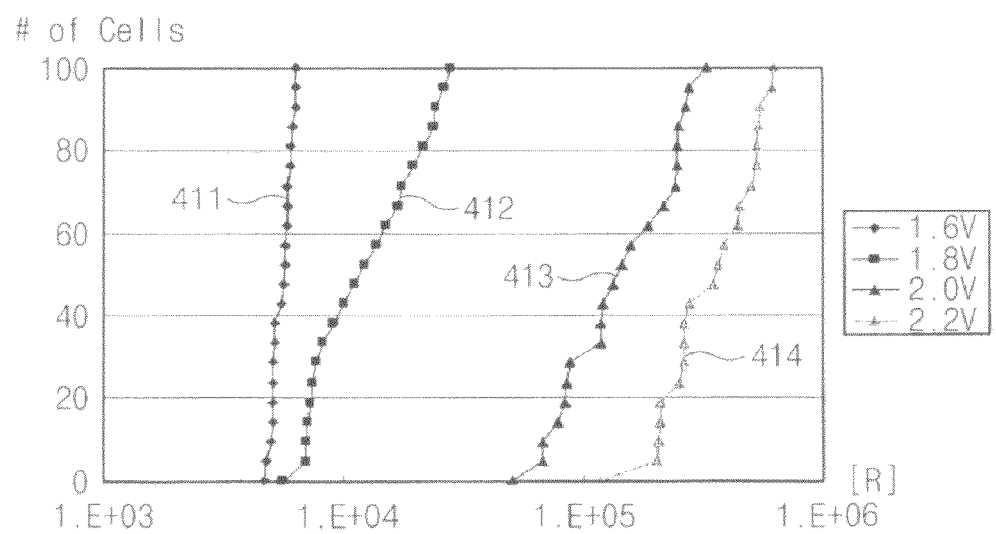
Figure 12A:
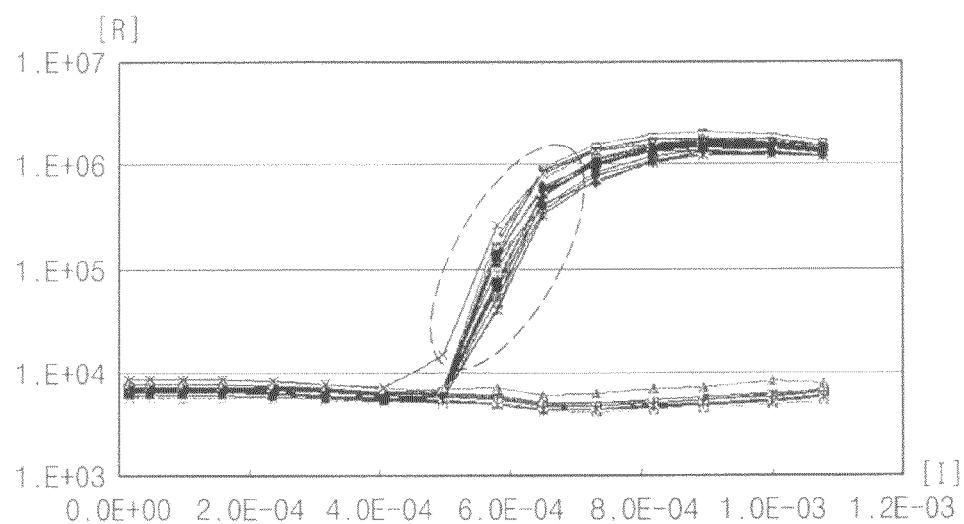
FIG. 12A is a diagram illustrating a current amount of a transition curve obtained when a typical square wave is used as a program signal for programming an intermediate state.
Figure 12B:
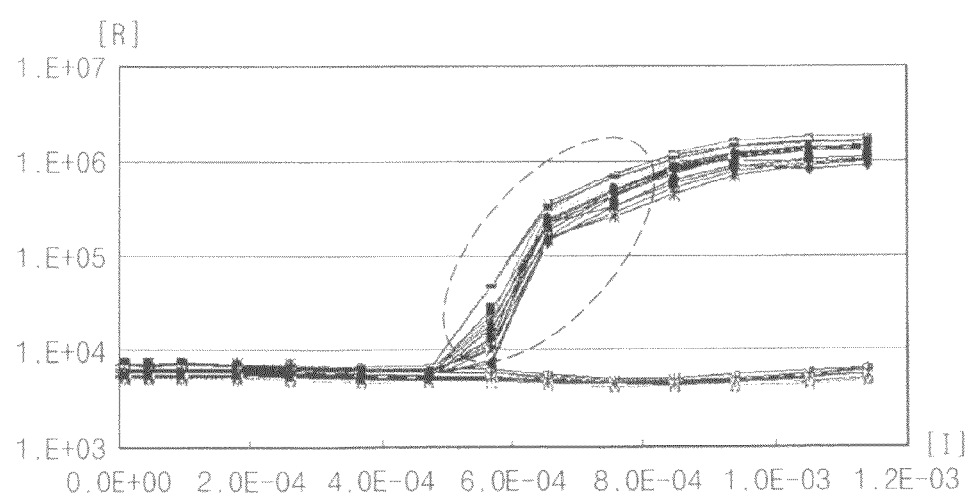
FIG. 12B is a diagram illustrating a current amount of a transition curve obtained when a triangular wave according to the present invention is used as a program signal for programming an intermediate state.

FIGS. 11A and 11B illustrate resistance distributions and transition curves that are obtained when a triangular wave according to the present invention is used as a program signal for programming an intermediate state and when a typical square wave is used as a program signal for programming an intermediate state. FIG. 11A illustrates a resistance distribution and a transition curve obtained when a typical square wave is used as a program signal for programming an intermediate state; and FIG. 11B illustrates a resistance distribution and a transition curve obtained when a triangular wave according to the present invention is used as a program signal for programming an intermediate state. FIG. 12A illustrates a current amount of a transition curve obtained when a typical square wave is used as a program signal for programming an intermediate state; and FIG. 12B illustrates a current amount of a transition curve obtained when a triangular wave according to the present invention is used as a program signal for programming an intermediate state.

Figure 1:
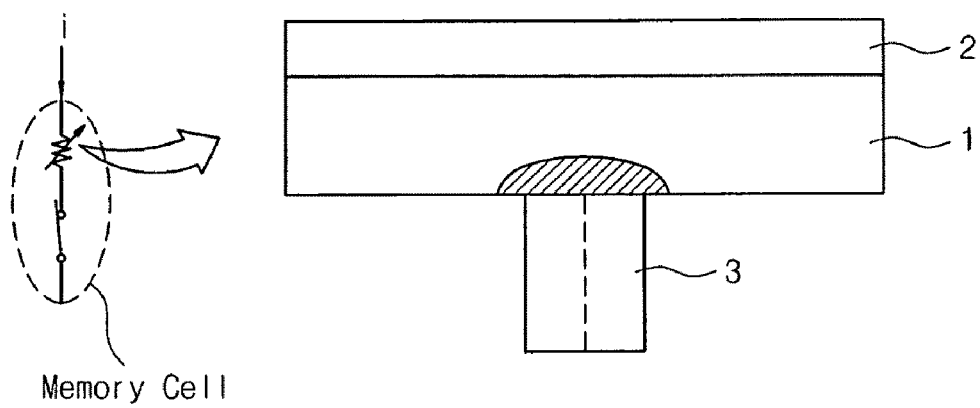
FIG. 1 is a diagram illustrating a cell structure of a typical phase change memory device.
Figure 2:
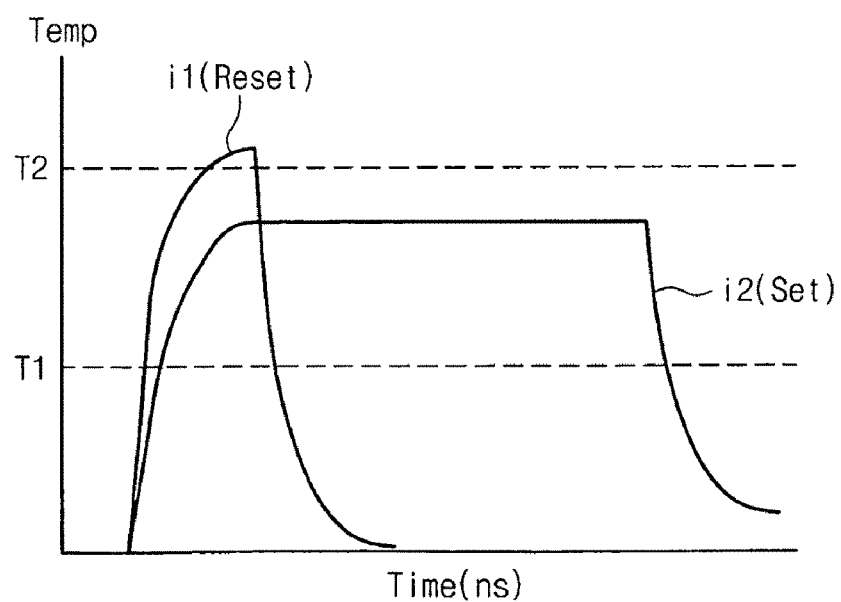
FIG. 2 is a diagram illustrating a temperature profile of a memory cell in a write operation of a typical phase change memory device.
Figure 3:
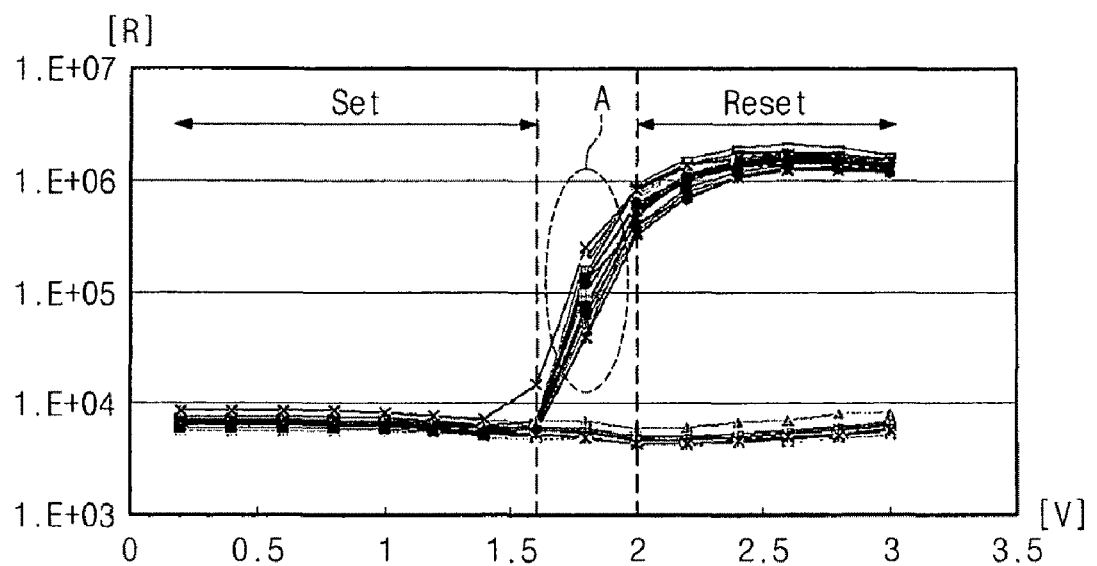
FIG. 3 is a graph obtained by repetitively applying a set pulse and a reset pulse to memory cells while gradually increasing a pulse voltage step by step.
Figure 3:
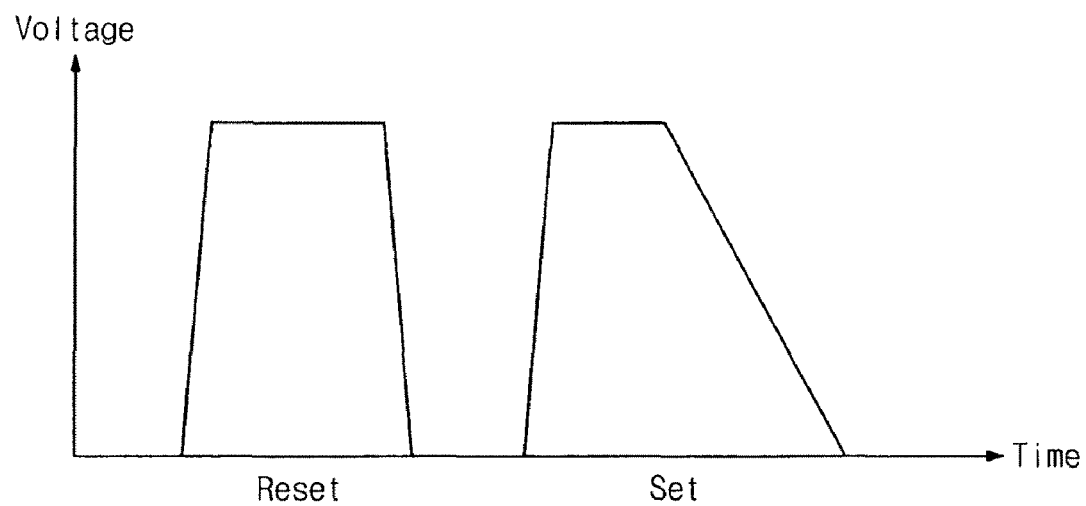

As can be seen from FIGS. 11A and 11B, a transition curve, which is obtained when a triangular wave having a rising time of about 200 ns to about 300 ns and a falling time of about 1 ns according to the present invention is used as a program signal, has a more gradual slope than a transition curve that is obtained when a typical square wave having a rising time of about 10 ns, a sustain time of 500 ns and a falling time of about 10 ns (see FIG. 3) is used as a program signal. That is, it can be seen from FIGS. 11A and 11B that a transition section has a gradual slope from a set state of the lowest state to a reset state of the highest state. That the transition section has a gradual slop means that the number of distinguishable resistance values increases. That is, that the transition section has a gradual slope means that the resistance value does not rapidly change. Herein, as described above, the transition curve can be obtained by applying a program signal with a gradually increasing pulse voltage to the memory cell. As can be seen from FIG. 11A, a minimum resistance value, an intermediate resistance value and a maximum resistance value, i.e., three resistance distributions 401, 402 and 403 are obtained when pulse voltages respectively having about 1.6 V, 1.8 V and 2.0 V are applied respectively to the memory cells. In contrast, as can be seen from FIG. 11B, a minimum resistance value, two intermediate resistance values and a maximum resistance value, i.e., four resistance distributions 411, 412, 413 and 414 are obtained when pulse voltages respectively having about 1.6 V, 1.8 V, 2.0V and 2.2 V are applied respectively to the memory cells. That is, as can be seen from the dotted portions of FIGS. 12A and 12B, that the resistance value does not rapidly change between the lowest state and the highest state means that the corresponding current does not rapidly change. That is, as can be seen from FIGS. 12A and 12B, a transition curve of a current, which is obtained when a triangular wave having a rising time longer than a falling time and having no sustain time according to the present invention is used as a program signal, has a more gradual slope than a transition curve of a current that is obtained when a typical square wave having a rising time of about 10 ns (see FIG. 3) is used as a program signal.

As described above, the triangular pulse having a rising time longer than a falling time is used as the reset pulse, i.e., the program signal necessary for programming the intermediate states. Thus, it is possible to achieve a large margin capable of programming the intermediate resistance values.

Although not illustrated in FIG. 4, the write driver circuit 280 of the multi-level phase change memory device according to the present invention may further include a pulse generator that is configured to generate one of the reset pulses illustrated in FIGS. 5 through 10 when the multi-bit data to be programmed corresponds to one of the intermediate states. However, those skilled in the art will recognize that the pulse generator can be embodied in the control logic unit 240.

A multi-level phase change memory device is a nonvolatile memory device that can retain stored data even without power supply. A phase change memory device supports a random data access function and provides rapid data read/write operations. This means that the phase change memory device is ideal for code storage. With an increase in the use of mobile devices such as cellular phones, PDAs, digital cameras, portable game consoles and MP3Ps, phase change memory devices are widely used for data storage as well as code storage. Phase change memory devices are also used in home appliances such as HDTVs, DVDs, routers and GPSs.

Figure 13:
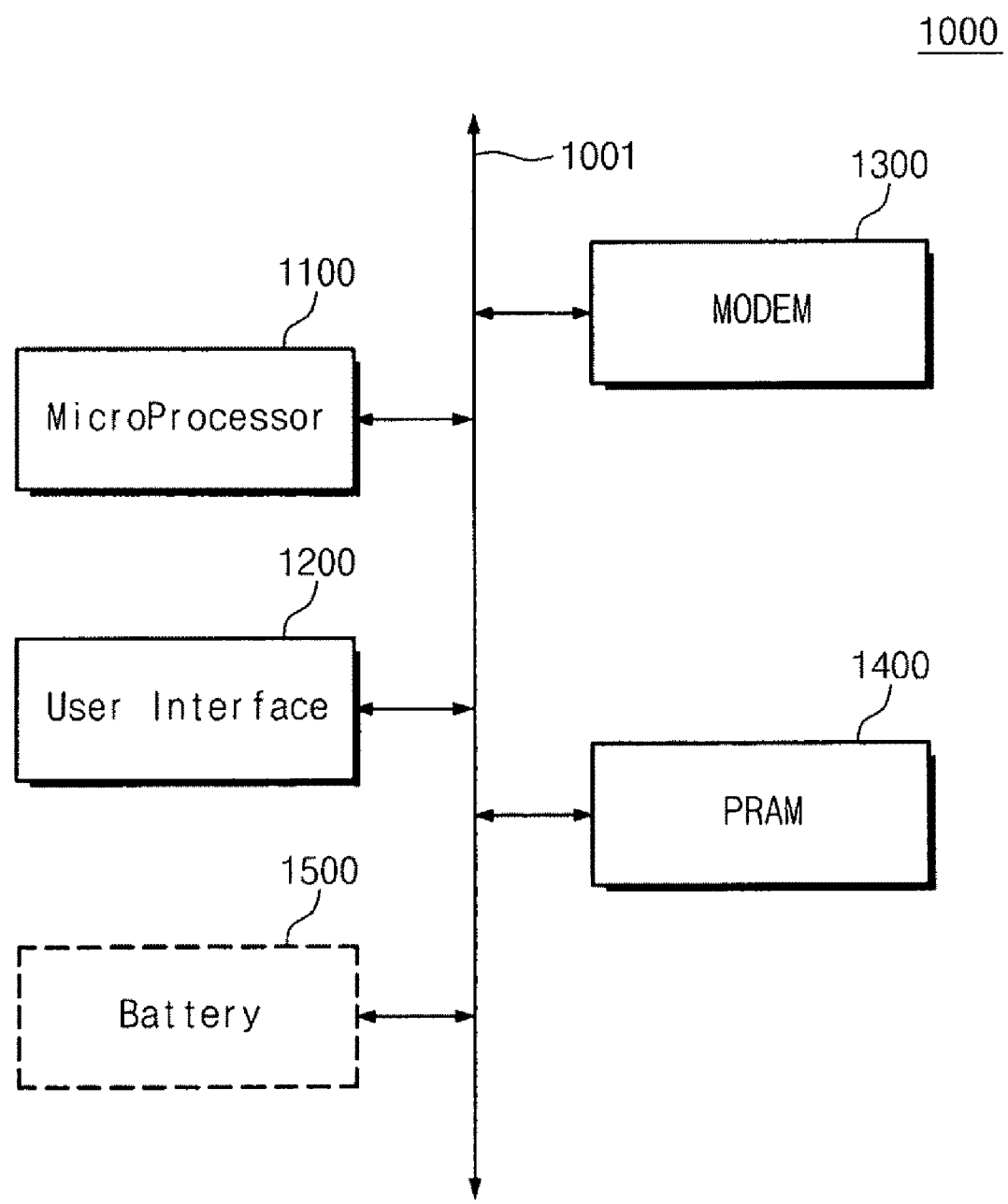
FIG. 13 is a block diagram of a system including a multi-level phase change memory system according to the present invention.

FIG. 13 is a block diagram of a system including the multi-level phase change memory system according to an exemplary embodiment of the present invention.

Referring to FIG. 13, a system 1000 according an exemplary embodiment of the present invention, such as a computing system and a mobile device, includes a microprocessor 1100, a user interface 1200, a modem 1300 such as a baseband chipset, and a phase change memory device 1400 (denoted by "PRAM") that are electrically connected to a bus 1001. The phase change memory device 1400 may be the same as that illustrated in FIG. 4. The phase change memory device 1400 stores N-bit data (N: an integer equal to or greater than 2) that is or will be processed by the microprocessor 1100. If the system 1000 is a mobile device, a battery 1500 is additionally provided to supply an operation voltage of the system 1000. Although not illustrated in FIG. 13, those skilled in the art will recognize that the system 1000 may further an application chipset, a camera image processor (CIS), a mobile DRAM device, and a NAND flash memory device.

In an exemplary embodiment of the present invention, the chalcogenide material includes Te, Se, S, a compound thereof, or an alloy thereof. In another exemplary embodiment, the chalcogenide material includes Te, Se, S, a compound thereof, or a material obtained by adding impurities (e.g., Bi, Sr, Si, C, N, or O) to an alloy thereof. In a further exemplary embodiment, the chalcogenide material includes one of Ge, Sb, Sn, As, Si, Pb, Te, Se, S, a compound thereof, and an alloy thereof. In a still further exemplary embodiment, the chalcogenide material includes Ge, Sb, Sn, As, Si, Pb, Te, Se, S, a compound thereof, or a material obtained by adding impurities (e.g., Bi, Sr, Si, C, N, or O) to an alloy thereof.

As described above, according to the multi-level phase change memory device of the present invention, the triangular pulse having a rising time longer than a falling time is used as the reset pulse, i.e., the program signal necessary for programming the intermediate states. Thus, it is possible to achieve a large margin capable of programming the intermediate resistance values.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A program method for a multi-level phase change memory device, comprising:
   receiving multi-level data to be programmed in a selected memory cell; and
   applying a SET, RESET, or an intermediate level program signal to the selected memory cell according to the received multi-level data,
   wherein a rising time of an intermediate level program signal is set to be longer than a falling time of the intermediate level program signal and the overall outline of the intermediate level program signal is of a right-triangle.

2. The program method of claim 1, wherein the received multi-level data corresponds to one of a lowest state, a highest state, and a plurality of intermediate states between the lowest state and the highest state.

3. The program method of claim 2, wherein when the received multi-level data corresponds to one of the intermediate states, the rising time of the program signal is set to be longer than the falling time of the program signal.

4. The program method of claim 3, wherein voltage levels of program signals corresponding respectively to the intermediate states are set differently depending on the intermediate states.

5. The program method of claim 4, wherein rising slopes of program signals corresponding respectively to the intermediate states are set equally regardless of the intermediate states.

6. The program method of claim 5, wherein the overall triangular outline is truncated and the program signal is set to have a sustain time between the rising time and the falling time.

7. The program method of claim 3, wherein voltage levels of program signals corresponding respectively to the intermediate states are set equally regardless of the intermediate states.

8. The program method of claim 7, wherein rising slopes of program signals corresponding respectively to the intermediate states are set differently depending on the intermediate states.

9. The program method of claim 8, wherein the overall triangular outline is truncated and the program signal is set to have a sustain time between the rising time and the falling time.

10. The program method of claim 3, wherein voltage levels of program signals corresponding respectively to the intermediate states are set equally regardless of the intermediate states; and rising slopes of program signals corresponding respectively to the intermediate states are set differently depending on the intermediate states.

11. The program method of claim 10, wherein the overall triangular outline is truncated and the program signal is set to have a sustain time between the rising time and the falling time.

12. The program method of claim 2, wherein when the received multi-level data corresponds to one of the intermediate states, the program signal has a triangular waveform whose rising time is set to be longer than a falling time.

13. A multi-level phase change memory device comprising:
   a memory cell array comprising a plurality of memory cells;
   a selector circuit configured to select at least one of the memory cells; and
   a write driver circuit configured to apply a SET, RESET, or intermediate level program signal to the selected memory cell according to multi-level data to be programmed in the selected memory cell,
   wherein a rising time of an intermediate level program signal is set to be longer than a falling time of the intermediate level program signal, and the overall outline of the intermediate level signal is of a right-triangle.

14. The multi-level phase change memory device of claim 13, wherein the multi-level data corresponds to one of a lowest state, a highest state, and a plurality of intermediate states between the lowest state and the highest state.

15. The multi-level phase change memory device of claim 14, wherein when the multi-level data corresponds to one of the intermediate states, the rising time of the program signal is set to be longer than the falling time of the program signal.

16. The multi-level phase change memory device of claim 15, wherein the overall triangular outline is truncated and the program signal is set to have a sustain time between the rising time and the falling time.

17. The multi-level phase change memory device of claim 13, wherein when the multi-level data corresponds to one of the intermediate states, the program signal has a triangular waveform whose rising time is set to be longer than a falling time.

18. A memory card comprising a multi-level phase change memory device that operates according to the program method of claim 1.

19. A computing system comprising a multi-level phase change memory device of claim 13.

* * * * *